(12) United States Patent
Ramaraju et al.

(10) Patent No.: US 7,349,266 B2
(45) Date of Patent: Mar. 25, 2008

(54) MEMORY DEVICE WITH A DATA HOLD LATCH

(75) Inventors: Ravindraraj Ramaraju, Round Rock, TX (US); George P. Hoekstra, Austin, TX (US); Prashant U. Kenkare, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 279 days.

(21) Appl. No.: 10/865,274

(22) Filed: Jun. 10, 2004

(65) Prior Publication Data

US 2005/0286327 A1    Dec. 29, 2005

(51) Int. Cl.
*G11C 7/10* (2006.01)

(52) U.S. Cl. .................. 365/189.05; 365/189.01; 365/189.04; 365/206

(58) Field of Classification Search ........... 365/189.05, 365/189.01, 189.04, 206
See application file for complete search history.

(56) References Cited

U.S. PATENT DOCUMENTS

| | | | | |
|---|---|---|---|---|
| 4,995,003 A | * | 2/1991 | Watanabe et al. | 365/189.05 |
| 5,185,722 A | * | 2/1993 | Ota et al. | 365/201 |
| 5,305,278 A | * | 4/1994 | Inoue | 365/230.03 |
| 5,353,251 A | * | 10/1994 | Uratani et al. | 365/189.05 |
| 5,515,315 A | * | 5/1996 | Uda et al. | 365/174 |
| 5,517,461 A | * | 5/1996 | Unno et al. | 365/233 |
| 5,612,713 A | * | 3/1997 | Bhuva et al. | 345/84 |
| 5,677,703 A | * | 10/1997 | Bhuva et al. | 345/84 |
| 5,732,026 A | * | 3/1998 | Sugibayashi et al. | 365/189.05 |
| 5,754,481 A | * | 5/1998 | Yabe et al. | 365/189.05 |
| 6,031,785 A | * | 2/2000 | Park et al. | 365/230.08 |
| 6,097,666 A | * | 8/2000 | Sakui et al. | 365/230.06 |
| 6,157,973 A | * | 12/2000 | Ohtani et al. | 710/100 |
| 6,195,301 B1 | | 2/2001 | Huffman et al. | |
| 6,198,659 B1 | * | 3/2001 | Hirano | 365/185.09 |
| 6,249,483 B1 | * | 6/2001 | Kim | 365/233 |
| 6,262,920 B1 | * | 7/2001 | Louie et al. | 365/189.05 |
| 6,301,153 B1 | * | 10/2001 | Takeuchi et al. | 365/185.11 |

(Continued)

FOREIGN PATENT DOCUMENTS

JP    407153254 A    *    6/1995

(Continued)

OTHER PUBLICATIONS

U.S. Appl. No. 10/412,490, filed Apr. 11, 2003.

*Primary Examiner*—Viet Q. Nguyen
(74) *Attorney, Agent, or Firm*—David G. Dolezal (57) ABSTRACT

A memory device includes a plurality of pairs of complimentary bit lines and a plurality of latch circuits. Each pair of the plurality of pairs of complimentary bit lines is coupled to a column of memory cells. Each latch circuit has an input coupled to a data line and a first output and a second output to provide complementary latched values dependent upon a value of the data line. For each latch of the plurality of latches, the first output is coupled to a first bit line of a pair of the plurality such that a value of the first bit line is continuously determined by the first output during memory device operation and the second output is coupled to a second bit line of the pair such that a value of the second bit line is continuously determined by the second output during memory device operation.

32 Claims, 4 Drawing Sheets

U.S. PATENT DOCUMENTS

| | | | |
|---|---|---|---|
| 6,324,110 B1 * | 11/2001 | Leung et al. | 365/207 |
| 6,470,467 B2 * | 10/2002 | Tomishima et al. | 714/744 |
| 6,570,799 B1 * | 5/2003 | Parris | 365/203 |
| 6,674,673 B1 * | 1/2004 | Hsu et al. | 365/200 |
| 6,714,451 B2 * | 3/2004 | Ooishi et al. | 365/185.09 |
| 6,859,400 B2 * | 2/2005 | Arakawa | 365/189.05 |
| 6,958,507 B2 | 10/2005 | Atwood et al. | |
| 7,158,413 B2 * | 1/2007 | Kasai et al. | 365/185.18 |
| 2003/0179620 A1 | 9/2003 | Arakawa | |

FOREIGN PATENT DOCUMENTS

| | | | |
|---|---|---|---|
| JP | 410228792 A * | 8/1998 | |

* cited by examiner

MEMORY DEVICE WITH A DATA HOLD LATCH

FIELD OF THE INVENTION

The present invention relates to integrated circuits, and more specifically to memory devices.

RELATED ART

In multi-port memory devices, memory read and memory write operations are heavily influenced by the amount of time necessary to perform such operations. During a write operation, input data assertion time may vary depending upon the decode delay associated with attributes of the memory device. For example, the uncertainty associated with the dependency of the input data may cause processor failures due to false data being written into memory when the assertion time is insufficient.

Therefore, the need exists for a memory design that improves memory performance.

BRIEF DESCRIPTION OF THE DRAWINGS

The present invention is illustrated by way of example and not limited to the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment, a memory device includes a bit line, a column of memory cells, and a latch circuit. The column of memory cells is coupled to the bit line. The latch circuit has an input coupled to a data line and an output that provides a latched value dependent upon a value of the data line. The output is coupled to the bit line such that a value of the bit line is continuously determined by the output during memory device operation.

One embodiment relates to a method of operating a memory device. A plurality of reads and a plurality of writes to memory cells of a column of memory cells is performed. A value of a bit line coupled to the column of memory cells where the value of the bitline is continuously controlled by the latch output during operation of the memory device. In one embodiment, a value of the latch output may be changed in response to a value of the latch input at a time determined by a change in state of a clock signal from a first state to a second state. In one embodiment, a value may be written to a memory cell of the column of memory cells, wherein the writing includes, for example, changing a state of the bitline. In one embodiment, a value may be written to a memory cell of the column of memory cells, wherein the writing includes, for example, changing the state of a write line from a non write state to a write state.

In one embodiment, a memory device includes a bit line, a column of memory cells, and a latch circuit. The column of memory cells is coupled to the bit line. The latch circuit has an input coupled to a data line and an output to provide a latched value dependent upon a value of the data line. The output is connected to the bit line.

In one embodiment, a memory device includes a plurality of pairs of complimentary bit lines and a plurality of latch circuits. Each pair of the plurality of pairs of complimentary bit lines is coupled to a column of memory cells. Each latch circuit has an input coupled to a data line and a first output and a second output to provide complementary latched values dependent upon a value of the data line. For each latch of the plurality of latch circuits, the first output is coupled to a first bit line of a pair of the plurality such that a value of the first bit line is continuously determined by the first output during memory device operation and the second output is coupled to a second bit line of the pair such that a value of the second bit line is continuously determined by the second output during memory device operation.

In one embodiment, a memory device includes a bit line, a column of memory cells, and a latch circuit. The column of memory cells is coupled to the bit line. The latch circuit has an input coupled to a data line and an output to provide a latched value dependent upon a value of the data line. The output is coupled to the bit line such that the value of the bit line changes if and only if the value at the output changes during memory device operation.

Figure 1:
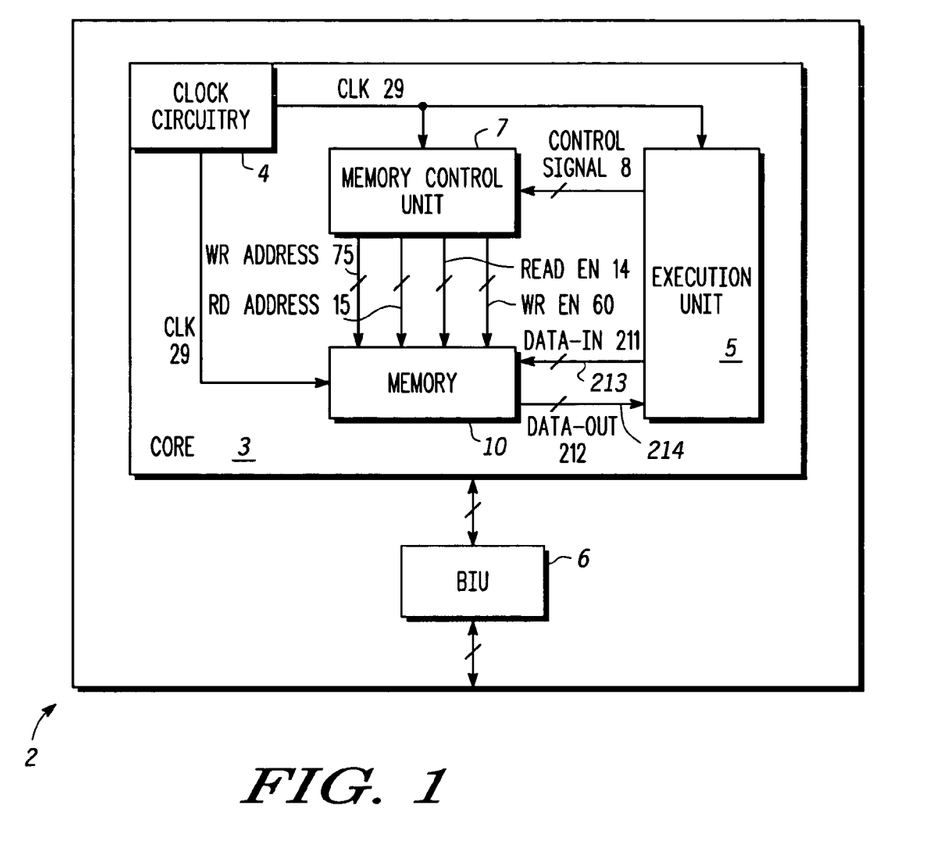
FIG. 1 illustrates a block diagram of an integrated circuit in accordance with one embodiment of the present invention.

FIG. 1 illustrates an integrated circuit 2 in accordance with one embodiment of the present invention. Integrated circuit 2 includes a core 3 and a bus interface unit (BIU) 6. Core 3 includes clock circuitry 4, an execution unit 5, a memory control unit 7, and a memory 10. In one embodiment, core 3 may be, for example, a processor core, and memory 10, may be characterized by, for example, a multi-port register file.

In one embodiment, during normal operation of integrated circuit 2, memory 10 is write accessed or read accessed based on control signal 8 provided from execution unit 5 to memory control unit 7. Control signal 8 may be used to initiate a memory read operation or a memory write operation. Execution unit 5, may be, for example, a central processing unit (CPU), or a digital signal processing unit issuing control signal 8 to store data into memory 10 or to read data from memory 10. Clock signal 29 (CLK 29), which in one embodiment is used as a timing mechanism to determine when data may be written to memory 10 or read from memory 10, is provided from clock circuitry 4 to memory control unit 7, execution unit 5, and memory 10. Memory control unit 7 receives clock signal 29 and control signal 8 from execution unit 5, and based upon whether a read operation or a write operation is requested by execution unit 5, asserts a write enable signal 60 (WR EN 60) or a read enable signal 14 (READ EN 14).

During a read operation, RD ADDRESS 15 and READ EN 14 are provided to memory 10 from memory control unit 7. Memory 10 receives READ EN 14 and enables the memory address location specified by RD ADDRESS 15. The data in the memory address location specified by RD ADDRESS 15 is read from memory 10 and provided to execution unit 5 as DATA-OUT 212 via data lines 214.

During a write operation, WR ADDRESS 75 and WR EN 60 are provided to memory 10 from memory control unit 7. Memory 10 receives WR EN 60 and enables the memory address location in memory 10 specified by WR ADDRESS 75 for write operation. Data from execution unit 5 (DATA-IN 211) is provided to memory 10 via data lines 213 and written to the memory address location of memory 10 specified by WR ADDRESS 75. Integrated circuit 2 may have other configurations in other embodiments.

Figure 2:
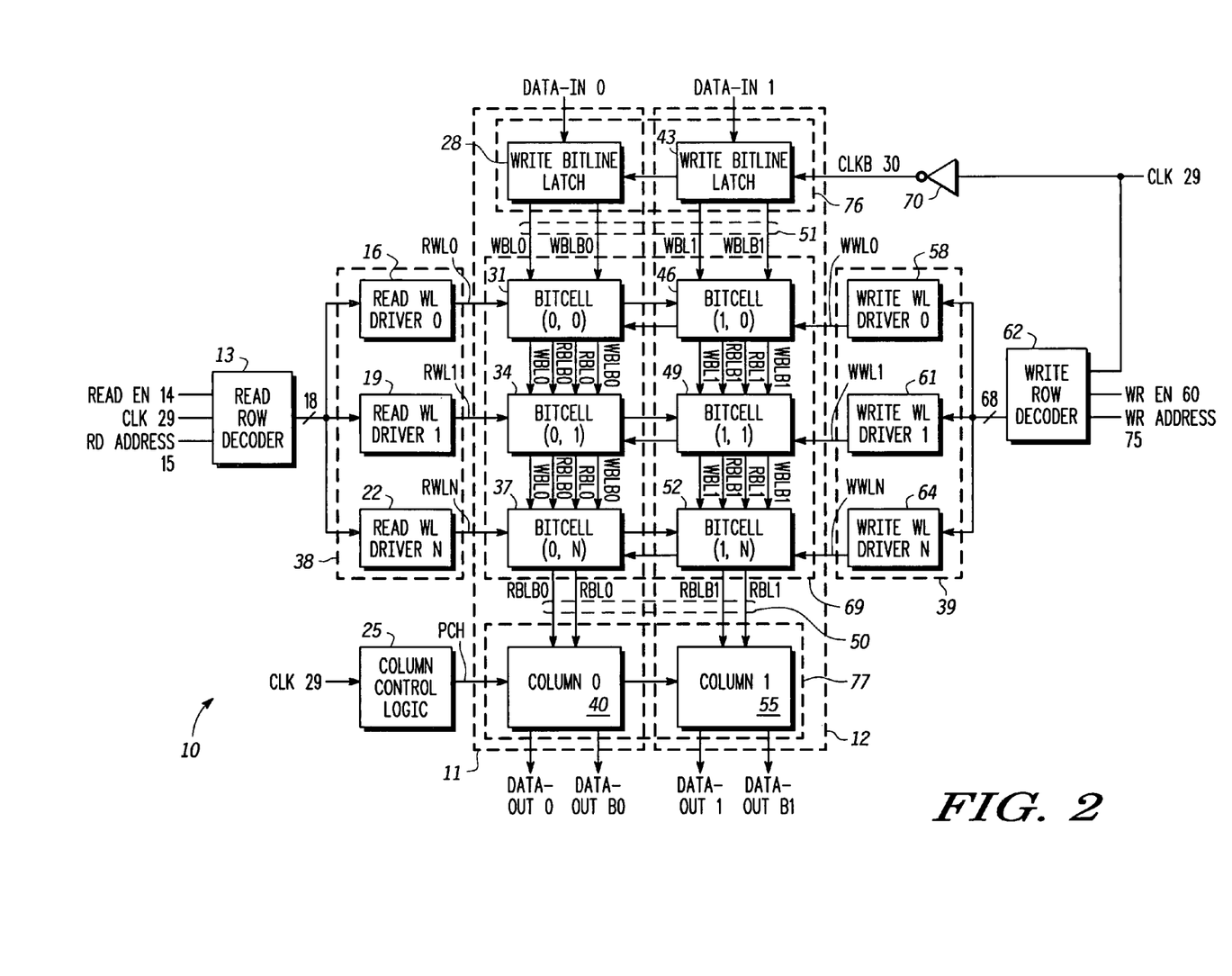
FIG. 2 illustrates a memory in accordance with one embodiment of the present invention.

FIG. 2 illustrates memory 10 in accordance with one embodiment of the present invention. Memory 10 includes a read row decoder 13, read word line drivers 38, write word line drivers 39, write bitline latches 76, column control logic 25, a column array circuit 11, a column array circuit 12, an inverter 70, a write row decoder 62, and column circuitry 77. Read word line drivers 38 includes a read word line driver 16, a read word line driver 19, and a read word line driver 22. Write word line drivers 39 includes a write word line driver 58, a write word line driver 61, and a write word line driver 64. Column array circuit 11 includes a write bitline latch 28, a bitcell (memory cell) 31, a bitcell 34, a bitcell 37, and column circuitry 40. Column array circuit 12 includes a write bitline latch 43, a bitcell 46, a bitcell 49, a bitcell 52, and column circuitry 55. For ease of explanation, bitcell 46, bitcell 49, bitcell 52, bitcell 31, bitcell 34, and bitcell 37 may be referred to as bitcell array 69, and write word line drivers 39 and write row decoder 62 may be referred to as word line generation circuitry. In the embodiment shown, bitcell 31 is located in the same row as bitcell 46.

In one embodiment, during a read operation, read row decoder 13 of memory 10 receives read enable signal 14 and read address 15 from memory control unit 7 (FIG. 1), and clock signal 29 from clock circuitry 4 (FIG. 1). Read row decoder 13 decodes read address 15 and determines the row of bitcells of bitcell array 69 to enable for read access. Bitcell array 69 may include one or more rows or columns of bitcells. Read row decoder 13 outputs a row enable signal 18 to at least one of read word line drivers 38 that corresponds to the decoded row address. The read word line driver of read word line drivers 38 that corresponds to the decoded row address asserts a read word line signal that is provided to the selected row or rows of bitcells. In the illustrated embodiment, read word line driver 16, read word line driver 19, or read word line driver 22 assert either of read word line signals RWL0, RWL1, RWLN, respectively. The selected row of bitcells provide read bit line signals (RBL0 and RBLB0) as input to column circuitry 40, and read bit line signals (RBL1 and RBLB1) as input to column circuitry 55. For the case when bit cell array 69 has multiple rows of bit cells, read bit line signals RBL0 and RBLB0, and read bit line signals RBL1 and RBLB1 may be provided to an addition row or rows of bitcells prior to being provided as input to column circuitry 40 and column circuitry 55. Similarly, for the case when bit cell array 69 has multiple columns of bit cells, read word line signals RWL0, RWL1, and RWLN may be provided to an additional column or columns of bitcells.

Column circuitry 40 and column circuitry 55 receive read bit line signals RBL0 and RBLB0 and read bit line signals RBL1 and RBLB1, respectively. Column circuitry 40 uses read line bit signals RBL0 and RBLB0 to generate output data (DATA-OUT 0 and DATA OUT B0) and column circuitry 55 uses the read bit line signals to generate output data (DATA-OUT 1 and DATA-OUT B1). The output data may then be provided to an execution unit, such as execution unit 5 shown in FIG. 1 for further processing. Note that alternate embodiments of memory 10 may include a single column array circuit 11 or a plurality of column array circuits not limited to those depicted in FIG. 2.

In one embodiment, during a write operation, write row decoder 62 receives write enable signal 60, clock signal 29, and write address 75. Write row decoder 62 decodes write address 75 and determines which row of bitcells to enable for write access. Write row decoder 62 outputs a row enable signal 68 to at least one of write word line drivers 39 that corresponds to the decoded row address. The write word line driver of write word line drivers 39 that corresponds to the decoded row address asserts a write word line signal that is provided to the selected row or rows of bitcells. In the illustrated embodiment, write word line driver 58, write word line driver 61, and write word line driver 64 assert either of write word line signals WWL0, WWL1, and WWLN, respectively, via the write word lines that couple write word line drivers 39 to bitcell array 69. In one embodiment, the write word line signal may change, for example, from a non-write state to a write state, at a time determined by a change of the state of clock signal 29. Input data (DATA-IN 0 and DATA-IN 1), which may be provided from, for example, execution unit 5 (not shown), is transferred into write bitline latches 76 (write bitline latch 28 and write bitline latch 43). Write bitline latches 76 receive the input data and inverted clock signal 29 (CLKB 30) that is inverted by inverter 70. Write bitline latches 76 uses CLKB 30 to drive the input data as write bitline signals WBL0, WBL1 and the compliment of the write bit line signals WBLB0, WBLB onto the write bitlines that couple write bitline latches 76 to bitcell array 69. The write bitline signals are then written onto the selected row of bitcells of bitcell array 69. For the case when bit cell array 69 has multiple rows of bit cells, write bit line signals WBL0 and WBLB0, and write bit line signals WBL1 and WBLB 1 may be provided to an addition row or rows of bitcells. Similarly, for the case when bit cell array 69 has multiple columns of bit cells, write word line signals WWL0, WWL1, and WWLN may be provided to an additional column or columns of bitcells. Memory 10 may have other configurations in other embodiments.

Figure 3:
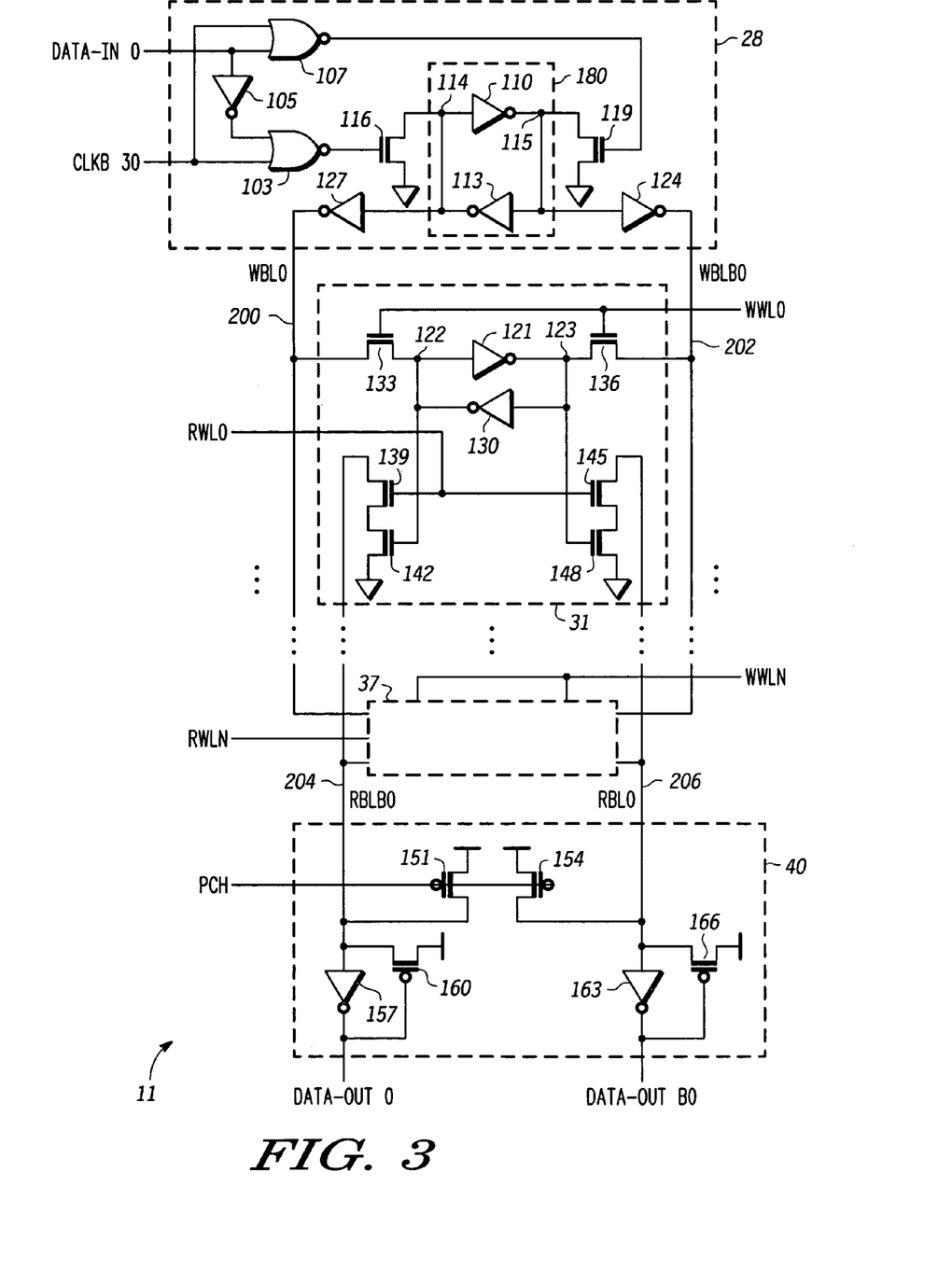
FIG. 3 illustrates column array circuitry in accordance with one embodiment of the present invention.

FIG. 3 illustrates one embodiment of column array circuitry 11. As illustrated, column array circuitry 11 includes write bitline latch 28, bitcell 31, bitcell 37, and column circuitry 40. Write bitline latch 28 is coupled to bitcell 31 and bitcell 37 via write bitline 200 and write bitline 202. In one embodiment, write bitline 202 is the complimentary bitline of write bitline 200. Bitcell 31 and bitcell 37 are coupled to column circuitry 40 via read bit line 204 and read bitline 206. In alternate embodiments, additional bitcells may be added to column array circuitry 11. Not shown in FIG. 3 is bitcell 34.

During a write operation, write bitline latch 28 of column array circuitry 11 receives clockbar signal 30 (CLKB 30) from inverter 70 (FIG. 2) and input data (DATA-IN 0) from execution unit 5 (FIG. 1). NOR gate 107 NORs DATA-IN 0 and clockbar signal 30 and provides its output to NMOS transistor 119. NOR gate 103 NORs clockbar signal 30 and the inverse of the input data DATA-IN 0 and provides its output to NMOS transistor 116.

In general, DATA-IN 0 and clockbar signal 30 may take on a range of assertion or deassertion values. In one embodiment, when clockbar signal 30 is high, the output of NOR gate 107 and the output of NOR gate 103 are low. As a result, NMOS transistor 119 and NMOS transistor 116 are turned off and latch 180, which includes inverter 110 cross coupled with inverter 113, actively holds the data value, if any, that was previously written into latch 180.

In one embodiment, when clockbar signal 30 is low and DATA-IN 0 is high, the output of NOR gate 107 is low and the output of NOR gate 103 is high. As a result, NMOS transistor 119 is turned off, NMOS transistor 116 is turned on, node 114 is pulled low, and the output of inverter 110 is high. The output of inverter 110 is inverted by inverter 113 and inverter 124. Inverter 113 inverts the output of inverter 110 and provides its output to inverter 127. The output of inverter 127, which is transitioned onto write bitline 200 as write bitline signal WBL0, is high. The output of inverter 124, which is transitioned onto write bitline 202 as write bitline bar signal WBLB0, is low. Both write bitline signal WBL0 and write bitline bar signal WBLB0 are provided to bitcell 31.

In one embodiment, when clockbar signal 30 is low and DATA-IN 0 is low, the output of NOR gate 107 is high and the output of NOR gate 103 is low. As a result, NMOS transistor 119 is turned on and NMOS transistor 116 is turned off. Since NMOS transistor 119 is on, node 115 is pulled low and the output of inverter 113 is high. The output of inverter 124, which is transitioned onto write bitline 202 as write bitline bar signal WBLB0, is high and the output of inverter 127, which is transitioned onto write bitline 204 as write bitline bar signal WBL0 is low. Hence, the values of write bitline signal WBL0 and write bitline bar signal WBLB0 at the outputs of write bitline latch 28 change values dependent upon a value of DATA-IN 0 at the input data line at a time determined by a change of state of clockbar signal 30. Similarly, a the values of write bitline signal WBL0 and write bitline bar signal WBLB0 of write bitline 200 and write bitline 202 may change in response to a value DATA-IN 0 on the input data line at a time determined by the change in state of the clock signal. Write bitline signal WBL0 and write bitline bar signal WBLB0 are provided to bitcell 31.

Bitcell 31 receives write bitline signal WBL0 from the output of inverter 127 at a current terminal of NMOS transistor 133 and write bitline bar signal WBLB0 from the output of inverter 124 at a current terminal of NMOS transistor 136. When write word line signal WWL0, which is provided to the control terminals of NMOS transistor 133 and NMOS transistor 136, is high, NMOS transistor 133 and NMOS transistor 136 are turned on. Node 122 is pulled to the value that has been transitioned onto write bit line 200 and node 123 is pulled to the value that has been transitioned onto write bitline 202. Hence, when WWL0 is high, bitcell 31 stores input data DATA-IN 0 that is provided as input into column array circuitry 11. When WWL0 is low, NMOS transistor 133 and NMOS transistor 136 are turned off and the data value written from write bitline 200 and write bitline 202 is stored using inverter 121 and inverter 130.

During a read operation, when read word line signal RWL0 on read word line 208 is high, NMOS transistor 139 and NMOS transistor 145 are turned on. The inverse of the value stored at node 122 and the inverse of the value stored at node 123 are transferred to read bitline 204 as read bitline bar signal RBLB0 and read bitline 206 as read bitline signal RBL0 using NMOS transistor 142 and NMOS transistor 148, respectively. When the precharge signal (PCH) that is provided as input to column circuitry 40 is high, PMOS transistor 151 and PMOS transistor 154 are turned off, and the value of read bitline signal RBLB0 on read bitline 204 is provided to inverter 157 and the value of read bitline signal RBL0 on read bitline 206 is provided to inverter 163. The output of inverter 157 is provided as output data DATA-OUT 0 to an execution unit (not shown) and to the control terminal of PMOS transistor 160. Similarly, the output of inverter 163 is provided as output data (DATA-OUT B0) to an execution unit (not shown) and to the control terminal of PMOS transistor 166. Depending upon the values of read bitline signal RBL0 and read bitline signal RBLB0, either PMOS transistor 160 or PMOS transistor 166 may be turned off. In other embodiments, write bitline latch 28, bitcell 31, bitcell 37, and/or column circuitry 40 may have other configurations. In the embodiment shown, the DATA-IN 0 signal is a single-ended signal, but in other embodiments, it may be another form of signal, such as, a differential signal.

Figure 4:
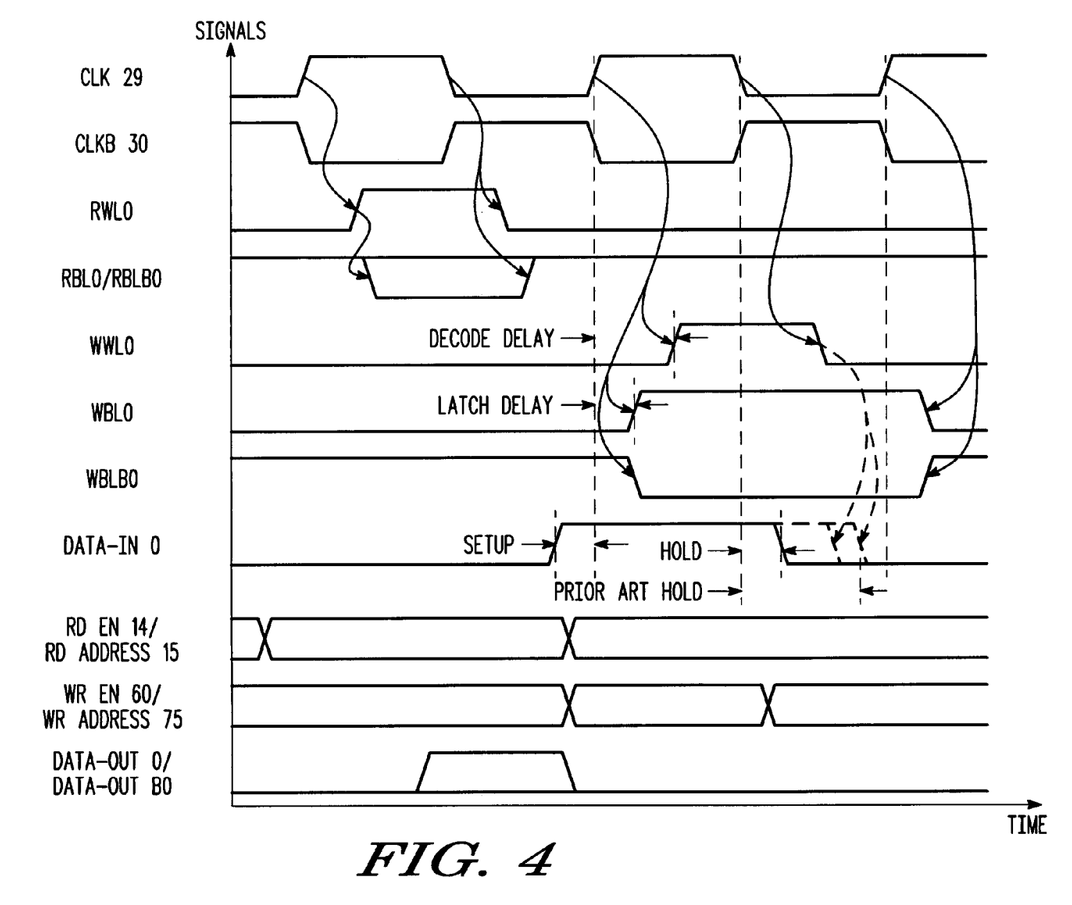
FIG. 4 illustrates a timing diagram representing various signals in accordance with one embodiment of the present invention.

FIG. 4 illustrates a timing diagram representing various signals for realizing reading and writing to bitcell 31 in accordance with one embodiment of the present invention. As depicted in one embodiment, during a read operation, when read enable signal 14 and clock signal 29 are high, read word line signal RWL0 is high. Read word line signal RWL0 may be asserted high after a delay caused by, for example, read row decoder 13 and read word line drivers 38. Once read word line signal RWL0 is high, read bitline signal RBL0 is low and read bitline bar signal RBLB0 is high, or read bitline signal RBL0 is high and read bitline bar signal RBLB0 is low. When read bitline signal RBL0 or read bitline bar signal RBLB0 is low, DATA-OUT 0 or DATA-OUT B0 is high. When clock signal 29 is low, read word line signal RWL0 is low, read bit line signal RBL0 and read bitline bar signal RBLB0 are high, and DATA-OUT 0 and DATA-OUT B0 are low.

As illustrated in FIG. 4, when DATA-IN 0 and clock signal 29 are high (clockbar signal 30 low), write bitline signal WBL0 is high and write bitline bar signal WBLB0 is low. During a write operation, when write enable signal 60 and clock signal 29 are high, write word line signal WWL0 is high. Write word line signal WWL0 may be asserted high after a delay caused by, for example, write row decoder 62 and write word line drivers 39. When clock signal 29 is low, write word line signal WWL0 is low.

As can be seen from the timing diagram of FIG. 4, a decode delay is associated with the assertion of clock signal 29 to the assertion of write word line signal WWL0. A latch delay is associated with the assertion of clock signal 29 to the assertion of write bitline signal WBL0. In one embodiment, during a write operation, write bitline signal WBL0 is held at a high value until the write word line signal WWL0 is low. Similarly, write bitline bar signal WBLB0 is held at a low value until write word line signal WWL0 is low. DATA-IN 0 is held high until clock signal 29 is low. As illustrated, the DATA-IN 0 assertion time is independent of the decode delay associated with write word line signal WWL0.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A memory device comprising:
a first write bit line;

a second write bit line, the second write bit line being a complementary bit line to the first write bit line;
a column of memory cells coupled to the first write bit line and the second write bit line;
a latch circuit having an input coupled to a data line and an output to provide a latched value dependent upon a value of the data line, the output is coupled to the first write bit line such that a value of the first write bit line is continuously determined by the output during memory device operation;
a first read bit line, the column of memory cells coupled to the first read bit line;
a second read bit line, the second read bit line being a complementary bit line to the first read bit line, the column of memory cells coupled to the second read bit line.

2. A memory device comprising:
a bit line;
a column of memory cells coupled to the bit line;
a latch circuit having an input coupled to a data line and an output to provide a latched value dependent upon a value of the data line, the output is coupled to the bit line such that a value of the bit line is continuously determined by the output during memory device operation;
wherein the latch includes a second input to receive a clock signal, wherein the output of the latch changes value dependent upon a value of the data line at a time determined by a change of state of the clock signal;
a word line coupled to a memory cell of the column of memory cells to carry a write signal to the memory cell;
word line generation circuitry having an output coupled to the word line to provide the write signal, the write generation circuitry including an input to receive a clock signal, wherein the write signal changes state at a time determined by a change of state of the clock signal received at the input of the write generation circuitry;
wherein the clock signal received by the write generation circuitry and the clock signal received at the second input of the latch are generated from a common clock signal.

3. The memory device of claim 2 wherein the bit line is a write bit line.

4. The memory device of claim 3 further comprising:
a read bit line, the column of memory cells coupled to the read bit line.

5. The memory device of claim 2 further comprising:
a second bit line, the second bit line being a complementary bit line to the bit line, the column of memory cells coupled to the second bit line.

6. The memory device of claim 1 wherein:
the latch circuit includes a second output, the second output is coupled to the second write bit line such that a value of the second bit line is continuously determined by the second output during memory device operation.

7. The memory device of claim 1 wherein:
the latch includes a pair of cross coupled inverters;
the output is coupled to an input of a first inverter of the pair and an output of the second inverter of the pair.

8. A memory device comprising:
a bit line;
a column of memory cells coupled to the bit line;
a latch circuit having an input coupled to a data line and an output to provide a latched value dependent upon a value of the data line, the output is coupled to the bit line such that a value of the bit line is continuously determined by the output during memory device operation;
a read bit line, the column of memory cells coupled to the read bit line;
wherein the bit line is a write bit line;
wherein the latch includes a pair of cross coupled inverters;
wherein the output is coupled to an input of a first inverter of the pair and an output of the second inverter of the pair;
wherein the latch includes a third inverter having an output connected to the output of the latch and an input connected to the input of the first inverter of the pair and the output of the second inverter of the pair.

9. The memory device of claim 2 wherein a value of the bit line is changed only in response to a value on the data line at a time determined by the change in state of the clock signal.

10. The memory device of claim 2 wherein:
the output of the latch changes value dependent upon a value of the data line at a time determined by a change in the state of the common clock signal from a first state to a second state;
the write signal changes from a non write state to a write state at a time determined by a change of state of the common clock signal from the first state to the second state.

11. The memory device of claim 10 wherein: the write signal changes from a write state to a non write state at a time determined by a change of state of the common clock signal from the second state to the first state.

12. The memory device of claim 1 further comprising:
a second bit line;
a second column of memory cells coupled to the second bit line;
a second latch circuit having an second input coupled to a second data line and a second output to provide a latched value dependent upon a value of the second data line, the second output is coupled to the second bit line such that a value of the second bit line is continuously determined by the second output during memory device operation.

13. The memory device of claim 12 wherein the column of memory cells includes a memory cell located in a same row as a memory cell of the second column of memory cells.

14. The memory device of claim 1 wherein the value of the first write bit line is changed only in response to a value of the data line.

15. The memory device of claim 1 wherein the memory device is characterized as a multi-port register file.

16. The memory device of claim 1 wherein the output is coupled to the first write bit line such that a value of the first write bit line is continuously determined by the output during memory device operation including all memory reads to a memory cell of the column.

17. An integrated circuit including a memory device of claim 1 wherein the integrated circuit further includes a processor core.

18. The memory device of claim 1 wherein reads and writes to memory cells of the column of memory cells are performed during memory device operation.

19. A method of operating a memory device comprising:
operating a memory device including performing a plurality of reads via a read bit line and a complementary read bit line and a plurality of writes via a write bit line and a complementary write bit line to memory cells of a column of memory cells, wherein the read bit line and the complementary read bit line are coupled to the column of memory cells and the write bit line and the complementary write bit line are coupled to the column of memory cells;

continuously controlling a value of the write bit line and the complementary write bit line with a first latch output and a second latch output, respectively, during the operating.

20. The method of claim 19 further comprising:

changing a value of the first latch output and a value of the second latch output in response to a value of a latch input at a time determined by a change in state of a clock signal from a first state to a second state.

21. The method of claim 19 further comprising:

writing a value to a memory cell of the column of memory cells, wherein the writing includes changing a state of the write bit line and changing a state of the complementary write bit line.

22. The method of claim 21 wherein:

the writing includes changing the state of a write line coupled to the memory cell from a non write state to a write state.

23. The method of claim 22 wherein:

the changing the state of the write bit line and the changing the state of the complementary write bit line each include changing the state at a time determined by a change in state of a clock signal from a first state to a second state;

the changing the state of the write line further includes changing the state at a time determined by a change in state of the clock signal from the first state to the second state.

24. The method of claim 23 wherein the writing further includes changing the state of the write line to the non write state from the write state at a time determined by a change in state of the clock signal from the second state to the first state.

25. The method of claim 21 wherein the writing further includes changing the state of the write line to the non write state from the write state at a time determined by the change in state of the clock signal from the first state to the second state.

26. The method of claim 21 wherein the writing includes changing the state of the write bit line from a first state to a second state, wherein the method further comprises:

writing another value to a memory cell of the column of memory cells after the writing, wherein the writing another value includes changing the state of the write bit line, wherein no other writing to a memory cell of the column is performed in between the changing the state of the writing and the writing another value;

wherein the write bit line remains at the second state from a time of the changing the state of the writing to the changing the state of the writing another value.

27. The method of claim 26 further comprising:

reading a value of a memory cell of the column after the writing and prior to the writing another value, wherein the write bit line remains at the second state regardless of the value of the memory cell being read.

28. The method of claim 19 wherein the operating the memory device further includes performing a plurality of reads and a plurality of writes to memory cells of a second column of memory cells, the method further comprises:

continuously controlling a value of a second bit line coupled to a second column of memory cells with a second latch output during the operating.

29. A memory device of claim 1 wherein the output is connected to the first write bit line.

30. The memory device of claim 29 further comprising:

a second bit line;

a second column of memory cells coupled to the second bit line;

a second latch circuit having a second input coupled to a second data line and a second output to provide a latched value dependent upon a value of the second data line, the second output is connected to the second bit line.

31. A memory device comprising:

a plurality of pairs of complimentary bit lines, wherein each pair of the plurality is coupled to a column of memory cells;

a plurality of latch circuits, each latch circuit having an input coupled to a data line and a first output and a second output to provide complementary latched values dependent upon a value of the data line;

wherein for each latch of the plurality, the first output is coupled to a first bit line of a pair of the plurality such that a value of the first bit line is continuously determined by the first output during memory device operation and the second output is coupled to a second bit line of the pair such that a value of the second bit line is continuously determined by the second output during memory device operation;

wherein the latch includes a second input to receive a clock signal, wherein the output of the latch changes value dependent upon a value of the data line at a time determined by a change of state of the clock signal.

32. A memory device comprising:

a first write bit line;

a second write bit line, the second write bit line being a complementary bit line to the first write bit line;

a column of memory cells coupled to the first write bit line and the second write bit line;

a latch circuit having an input coupled to a data line, a first output to provide a first latched value dependent upon a value of the data line, a second output to provide a second latched value dependent upon a value of the data line, the first output is coupled to the first write bit line such that the value of the first write bit line changes if and only if the value of the first output changes during memory device operation, the second output is coupled to the second write bit line such that the value of the second write bit line changes if and only if the value of the second output changes during memory device operation;

a read bit line, the column of memory cells coupled to the read bit line.

* * * * *